Nov. 30, 1965 TERUO HAYASHI ETAL 3,221,220
LOW CAPACITANCE SEMICONDUCTOR JUNCTION
Filed July 25, 1961
FIG. 1
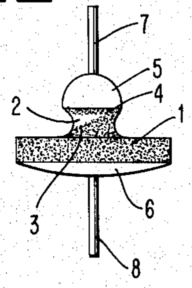
FIG. 2a
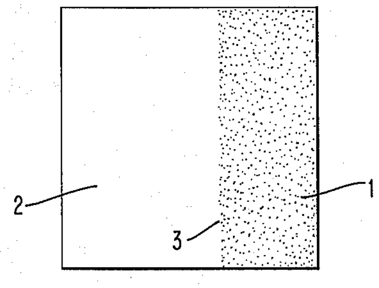
FIG. 3a
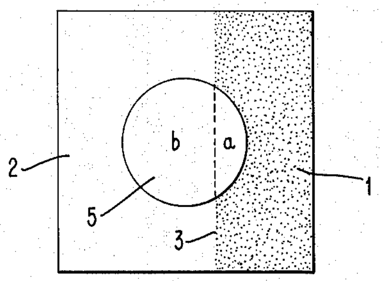
FIG. 2b
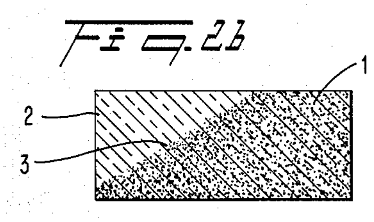
FIG. 3b
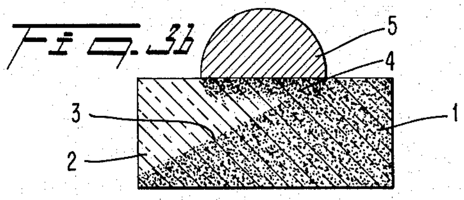
FIG. 5a
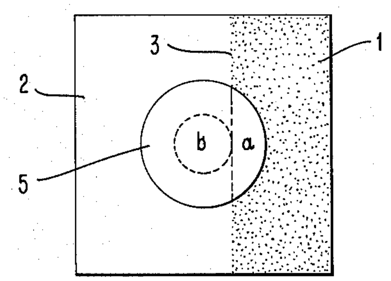
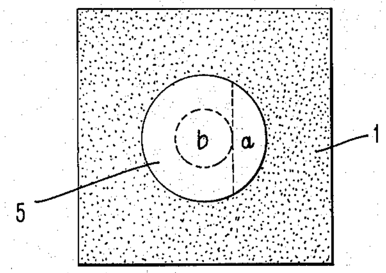
FIG. 5b
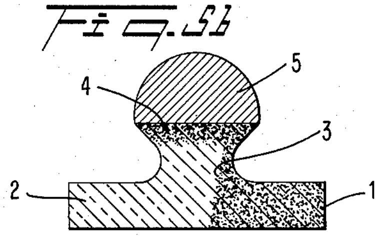
FIG. 4a, FIG. 4b
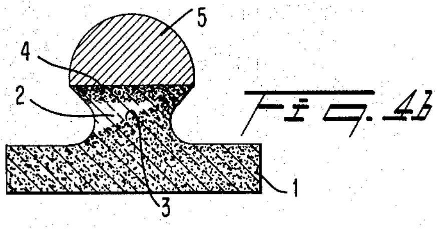
INVENTORS
TERUO HAYASHI
HISASHI WATANABE
BY Roy C. Hapgood
ATTORNEY United States Patent Office 3,221,220
Patented Nov. 30, 1965

3,221,220
LOW CAPACITANCE SEMICONDUCTOR JUNCTION

Teruo Hayashi and Hisashi Watanabe, Tokyo, Japan, assignors to Nippon Electric Company Limited, Tokyo, Japan, a corporation of Japan
Filed July 25, 1961, Ser. No. 126,671
Claims priority, application Japan, Aug. 25, 1960, 35/36,173
11 Claims. (Cl. 317—235)

This invention relates in general to junction type semiconductor devices and in particular to an improved junction structure which reduces junction capacitance to a low level without weakening the mechanical structure defining the junction. The invention is particularly useful in tunnel diodes, parametric amplifiers, microwave rectifiers, and other semiconductor devices which require relatively low capacitance junctions.

In some semiconductor devices, junction capacitance is increased to a very high level due to the factors which are inherent in the operation of the device. For example, in tunnel diodes it is required that the impurity concentrations in the P and N semiconductor regions defining a P–N junction be increased almost to the point of degeneration, i.e., the point where the semiconductor is so saturated with impurities that it becomes a conductor, and also that the space charge layer which constitutes the P–N junction be made as thin as $10^{-6}$ centimeters. The high impurity concentration and thin junction are necessary for achieving a high degree of tunneling through the junction, but at the same time they increase the junction capacitance per unit area to as much as $10^{7}$ micromicrofarads per square centimeter. Since a junction capacitance in the order of 1 micromicrofarad is required in VHF circuit applications, this means that the junction in a VHF tunnel diode must be less than $10^{-7}$ square centimenters in area. It will be appreciated by those skilled in the art that the fabrication of a junction which is $10^{-6}$ centimeters thick and $10^{-7}$ centimeters in surface area presents a serious problem, particularly if those junctions are to be mass produced. Under normal circumstances a junction of these dimensions would be so delicate as to be unusable in any practical application. It would break at the slightest mechanical or electrical shock.

This same situation is found in other semiconductor devices which require very thin junctions or very high impurity concentrations or both. The capacitance per unit area across a junction increases when the thickness of the junction is decreased and also when the impurity concentrations in the semiconductor regions defining the junctions are increased. Furthermore, the problem of junction capacitance becomes serious in junctions of moderate width and impurity concentrations when they are used in VHF, UHF or SHF circuit applications.

Accordingly, one object of this invention is to provide an improved junction structure which combines the advantages of low capacitance and high mechanical strength.

Another object of this invention is to provide an improved junction structure which can be used in semiconductor devices having high impurity concentrations and thin junctions to decrease junction capacitance to a low level without mechanically weakening the junction structure or adversely affecting its electrical characteristics.

A further object of this invention is to provide an improved junction structure which is adapted to define junctions having extremely small surface areas and very high mechanical strength.

An additional object of this invention is to provide an improved junction structure in which the mechancal strength of the junction is substantially independent of the surface area thereof.

Other objects and advantages of the invention will be apparent to those skilled in the art from the following description of one specific embodiment thereof, as illustrated in the attached drawings, in which:

FIG. 1 is an elevation section of a tunnel diode embodying one illustrative junction structure of this invention;

FIG. 2 is an elevation section showing the first step in fabricating the tunnel diode of FIG. 1;

FIG. 3 is an elevation section showing the second step in fabricating the tunnel diode of FIG. 1;

FIG. 4 is an elevation section showing the third step in fabricating the tunnel diode of FIG. 1; and FIG. 5 is an elevation section showing a modification of the tunnel diode of FIG. 1.

In FIGS. 2 to 5, *a* is a top view and *b* is a side view.

FIG. 1 shows a tunnel diode embodying the novel junction structure of this invention and FIGS. 2, 3, and 4 show various steps in fabricating the tunnel diode of FIG. 1. The first step (FIG. 2) comprises forming a relatively high impurity concentration region 1 and a relatively low impurity concentration region 2 in a semiconductor material and cutting a wafer in which the regions 1 and 2 are both exposed on one surface of the wafer. The boundary 3 between the high and low concentration regions is, of course, a transition zone in which the concentration changes from low to high, and this transition zone is preferably narrow in width for reasons which are discussed below. The high and low impurity zones can be formed by the prior art alloying methods, wafer dipping methods, diffusion methods, or the like. In the particular example disclosed herein the regions are formed by fusing an indium-arsenic alloy (5% arsenic by weight) with an N-type germanium crystal having an impurity concentration of $5\times10^{13}$ units per cubic centimeter. The indium-arsenic alloy forms an N-type recrystallized region having an impurity concentration of $3\times10^{19}$ units per cubic centimeter, which constitutes the high impurity concentration region 1 of FIG. 2. The N-type germanium crystal constitutes the low impurity concentration region in this particular example.

After the high and low impurity concentration regions have been formed, as described above, a relatively large P-N junction is formed on the surface which contains both the low impurity concentration region and the high impurity concentration region. This P-N junction is formed by fusing an indium-gallium alloy 5 to the surface so that a P type recrystallized zone 4 is formed in both the low impurity concentration region 2 and the high impurity concentration region 1. The indium-gallium alloy 5 contains 0.5% gallium by weight, which produces a P type impurity concentration of $8\times10^{19}$ units per cubic centimeter in recrystallized zone 4. Thus recrystallized zone 4 defines two separate P-N junctions: one junction between a high concentration P type impurity zone and a high concentration N type impurity zone, and the other junction between a high concentration P type impurity zone and a low concentration N type impurity zone. The relative size of the two P-N junctions depends on the size, shape, and placement of the indium-gallium alloy 5, as shown in FIG. 3. In this particular example the indium-gallium alloy 5 is a circle of approximately 0.1 millimeters in diameter and it is placed to define a relatively small contact area *a* with high concentration region 1 and a relatively large contact area *b* with low concentration region 2. The P-N junction in contact area *a* is a characteristic tunnel diode junction but the P-N junction in contact area *b* is much higher in impedance and much lower in capacitance than a tunnel diode junction. With the particular materials and impurity concentrations described above, the capacitance per square centimeter in area *b* is approximately one thousandth of the capacitance per square centimeter in area *a*. The total capacitance of the junction is the sum of the capacitance of contact area *a* and contact area *b*. Therefore the total capacitance of the junction can be set to any desired level by varying the ratio between area *a* and area *b*.

The desired ratio of areas is obtained by first placing the indium-gallium alloy 5 in an approximately correct position before recrystallized zone 4 is formed, and then etching away portions of the semiconductor material with a 15% solution of sodium hydroxide to produce the configuration shown in FIG. 4. This etching process can be controlled in accordance with any suitable prior art mechanisms or techniques, but it is preferable to use the new technique and new mechanisms disclosed in copending application Serial Number 126,625, now Patent No. 3,150, 021, filed on July 25, 1961 for a "Method of Manufacturing Semiconductor Devices," invented by Akihiko Sato. In this particular example the etching is controlled to produce a total P-N junction area of $5\times10^{-6}$ square centimeters, and the ratio of area *b* to area *a* is selected to be in the order of 100 to one. This produces a tunnel diode junction whose total capacitance is about 1 micromicrofarad, which is low enough for VHF circuit applications, and whose mechanical strength is equivalent to a prior art tunnel diode junction having a capacity of 1,000 micromicrofarads. It should be noted, too, that the capacitance of this junction could be reduced still further without weakening the junction by one whit. The mechanical srength of the junction, which is determined by the total contact area, would not be changed if contact area *b* were reduced to the vanishing point.

After the novel junction of this invention has been completed, the tunnel diode assembly is finished by attaching electrodes 7 and 8, as shown in FIG. 1, and then encapsulating the diode by well known prior art techniques. The final assembly will be mechanically rugged because of its relatively large junction surface area and also very low in capacitance because of its small tunnel junction area. Its electrical characteristics will, however, be substantially simliar in other respects to prior art tunnel diodes. The impedance of the P-N junction in the non tunnel junction area is large enough so that this area does not substantially affect the operation of the device except to reduce capacitance and increase strength. The impedance of the non tunnel junction area can be increased, if desired, by extending the low impurity concentration region 2 into the base of the structure, as shown in FIG. 5, but the arrangement shown in FIGS. 1 through 4 will be preferable in most applications of the invention due to its lower base impedance. The arrangement shown in FIG. 5, however, has approximately the same capacitance as the arrangement shown in FIGS. 1 through 4, and it might be preferable in some applications which call for a higher base impedance.

Although the invention has been described above in connection with a specific type of tunnel diode, it should be clearly understood that the invention is by no means limited to that specific type of tunnel diode or to tunnel diodes in general. This invention comprises a novel semiconductor junction structure which can be used in any suitable semiconductor device. The invention can be used in parametric amplifiers, microwave rectifiers, and any other devices which would benefit from the advantages that spring from the junction structure of this invention. It should also be understood that the junction structure of this invention is by no means limited to the specific dimensions, materials, or impurity concentrations described herein by way of example. Many modifications can be made in the specific junction structure described herein without departing from the basic teaching of this document, and this invention includes all modifications falling within the scope of the following claims.

What is claimed is:

1. A low capacitance semiconductor junction structure comprising a semiconductor material containing a first region having a relatively high concentration of a first type of impurity, a second region adjacent to said first region and forming a generally planar boundary therewith, said second region having a relatively low concentration of said first type impurity, a third region adjacent to said first and second regions, said third region having a relatively high concentration of a second type of impurity, a low capacitance junction being defined by the boundary separating said third region from said first and second regions, said third region producing a junction in which a predetermined ratio exists between the boundary area separating said third region from said first region and the boundary area separating said third region from said second region, to provide a reduced junction capacitance, one of said boundary areas also being of generally planar shape and being disposed in angular relation with respect to said generally planar boundary.

2. The combination defined in claim 1 wherein the boundary area separating said third region from said first region is smaller than the boundary area separating said third region from said second region.

3. The combination defined in claim 2 wherein the total area of said boundary and the ratio between the portion thereof adjacent to said first region and the portion thereof adjacent to said second region are adapted to produce a predetermined value of capacitance across said junction.

4. A method of fabricating a low capacitance semiconductor junction, comprising the steps of (A) forming a first impurity region in a semiconductor material, said first impurity region containing a relatively low concentration of a first type of impurity, (B) forming a second impurity region in the semiconductor material adjacent to said first impurity region therein, said second impurity region defining a generally planar boundary wiht said first impurity region, said second impurity region containing a relatively high concentration of said first type of impurity, and (C) forming a third impurity region in the semiconductor material adjacent to said first and second impurity regions in such a manner that a predetermined ratio exists between the boundary area separating said third region from said first region and the boundary area separating said third region from said second region, one of said boundary areas also being of generally planar shape and being disposed in angular relation with respect to said generally planar boundary, said third impurity region containing a relatively high concentraton of a second type of impurity, and a low capacitance junction being defined by the boundary separating said third region from said first and second regions.

5. The method defined in claim 4 wherein said third impurity region is formed in such manner as to produce a junction boundary having a predetermined total surface area and a predetermined ratio between the portion thereof adjacent to said first region and the portion thereof adjacent to said second region so as to produce a predetermined value of capacitance across said junction.

6. The method defined in claim 5 wherein the boundary area separating said third region from said second region is small with respect to the boundary area separating said third region from said first region.

7. A tunnel diode comprising a semiconductor material containing a first impurity region having a relatively low concentration of a first type of impurity, a second impurity region adjacent to said first impurity region and forming a generally planar boundary therewith, said second impurity region having a relatively high concentration of said first type of impurity, a third impurity region adjacent to said first and second impurity regions, said third impurity region having a relatively high concentration of a second type of impurity, the boundary area separating said third impurity region from said second impurity region being smaller than the boundary area separating said third impurity region from said first impurity region, said third impurity region defining a predetermined total boundary area separating it from said first and second impurity regions and also defining a predetermined ratio between the area thereof adjacent said first impurity region and the area thereof adjacent said second impurity region, one of said boundary areas also being of generally planar shape and being disposed in angular relation with respect to said generally planar boundary, a first terminal coupled to said third impurity region, and a second terminal coupled to said first and second impurity regions, whereby a reduced junction capacitance is produced between said terminals.

8. The combination defined in claim 7 wherein the concentration of impurities in said first impurity concentration region is in the order of $10^{13}$ units per cubic centimeter and wherein the concentration of impurities in said second and third impurity concentration regions is in the order of $10^{18}$ units per cubic centimeter.

9. The combination defined in claim 7 wherein said semiconductor material comprises germanium, and wherein the concentration of impurities in said first impurity concentration region is approximately $5\times10^{13}$ units per cubic centimeter, and wherein the concentration of impurities in said second and third impurity concentration regions is approximately equal to $3\times10^{19}$ units per cubic centimeter, and wherein said total boundary area is approximately equal to $5\times10^{-6}$ square centimeters, and wherein said ratio of areas is in the order of 100 to 1.

10. The combination defined in claim 9 wherein said first and second impurity concentrations contain N type impurities and wherein said third impurity concentration region contains P type impurities.

11. The combination defined in claim 10 wherein said semiconductor material is N type germanium containing N type impurities in a concentration approximately equal to $5\times10^{13}$ units per cubic centimeter, and wherein said second impurity concentration region is formed by fusing an indium-arsenic alloy containing 5% arsenic by weight to said semiconductor material, and wherein said third impurity concentration region is formed by fusing an indium-gallium alloy containing 0.5% gallium by weight to said semiconductor material.

References Cited by the Examiner

UNITED STATES PATENTS

| | | | |
|---|---|---|---|
| 2,937,114 | 5/1960 | Shockley | 317—235 |
| 3,079,512 | 2/1963 | Rutz | 317—234 |
| 3,114,864 | 12/1963 | Chih-Tang Sah | 317—234 |

DAVID J. GALVIN, *Primary Examiner.*

GEORGE N. WESTBY, JAMES D. KALLAM, *Examiners.*